United States Patent [19]
Yamazaki

[11] Patent Number: 4,860,069
[45] Date of Patent: Aug. 22, 1989

[54] NON-SINGLE-CRYSTAL SEMICONDUCTOR LIGHT EMITTING DEVICE

[75] Inventor: Shunpei Yamazaki, Tokyo, Japan

[73] Assignee: Semiconductor Energy Laboratory Co., Ltd., Kanagawa, Japan

[21] Appl. No.: 104,539

[22] Filed: Oct. 2, 1987

Related U.S. Application Data

[63] Continuation of Ser. No. 653,860, Sep. 24, 1984, abandoned.

[30] Foreign Application Priority Data

Sep. 24, 1983 [JP] Japan ............................ 58-176615
Sep. 24, 1983 [JP] Japan ............................ 58-176616

[51] Int. Cl.$^4$ ............................................ H01L 33/00
[52] U.S. Cl. ................................. 357/17; 357/2; 357/58; 357/59; 357/63
[58] Field of Search .................. 357/2, 17, 58, 59, 63

[56] References Cited

U.S. PATENT DOCUMENTS

| 4,342,044 | 7/1982 | Oushinsky et al. | 357/63 |
| 4,409,605 | 10/1983 | Oushinsky et al. | 357/63 |
| 4,527,179 | 7/1985 | Yamazaki | 357/17 |

Primary Examiner—Edward J. Wojciechowicz
Attorney, Agent, or Firm—Gerald J. Ferguson, Jr.

[57] ABSTRACT

A non-single-crystal semiconductor light emitting device comprising a first electrode, a first conductiveity type non-single-crystal semiconductor layer formed on the first electrode, a non-single-crystal semiconductor region formed on the first non-single-crystal semiconductor layer, a second conductivity type non-single-crystal semiconductor layer formed on the nonsingle-crystal semiconductor region, and a second electrode formed on the second non-single-crystal semiconductor layer. The non-single-crystal semiconductor region is formed by a third non-single-crystal semiconductor layer or a laminate member made up of a plurality m (where $m \geq 3$) of non-single-crystal semiconductor layers $M_1, M_2, \ldots M_m$. The third non-single-crystal semiconductor layer and even-numbered non-single-crystal semiconductor layer $M_i$ ($i=2, 4, \ldots (m-1)$) are formed of silicon and so doped with hydrogen or fluorine in an amount of more than 30 atom % as to provide it an $(SiH_2)_n$ or $(SiF_2)_n$ structure. The odd-numbered non-single-crystal semiconductor layers $M_{(i-1)}$ and $M_{(i+1)}$ have larger energy band gaps than does the even-numbered non-single-crystal semiconductor layer $M_i$.

10 Claims, 2 Drawing Sheets

NON-SINGLE-CRYSTAL SEMICONDUCTOR LIGHT EMITTING DEVICE

This application is a continuation of Ser. No. 653,860, filed Sept. 24, 1984, now abandoned.

BACKGROUND OF THE INVENTION

1. Field of the Invention

The present invention relates to a non-single-crystal semiconductor light emitting device which is produced through using a non-single-crystal semiconductor.

2. Description of the Prior Art

Conventionally known as a non-single-crystal semiconductor light emitting device is one that comprises a first electrode, a first non-single-crystal semiconductor layer of a first conductivity type, which is formed on the first electrode and makes ohmic contact therewith, an i-type non-single-crystal semiconductor region formed on the first non-single-crystal semiconductor layer, a second non-single-crystal semiconductor layer of a second conductivity type reverse from the first conductivity type, which is formed on the i-type non-single-crystal semiconductor region, and a second electrode which is formed on the second non-sigle-crystal semiconductor layer and makes ohmic contact therewith.

In this case, the first non-single-crystal semiconductor layer, the i-type non-single-crystal semiconductor region and the second non-single-crystal semiconductor layer are doped with a dangling bond and recombination center neutralizer such as hydrogen, or halogen such as fluorine, and the i-type non-single-crystal region is formed by a single non-single-crystal semiconductor layer.

With the light emitting device of such a construction, when connecting a DC bias source of a predetermined polarity between the first and second electrode, electrons (or holes) are injected into the i-type non-single-crystal semiconductor region from the first electrode towards the second electrode, and holes (or electrons) are injected into the i-type non-single-crystal semiconductor region from the second electrode towards the first electrode layer. The electrons (or holes) injected into the i-type non-single-crystal semiconductor region from the first electrode flow towards the second electrode without being accumulated at the bottom of the conduction band (or valence band) of the single non-single-crystal semiconductor layer forming the i-type non-single-crystal semiconductor region. Similarly, the holes (or electrons) injected into the i-type non-single-crystal semiconductor region from the second electrode flow towards the first electrode layer without being accumulated at the bottom of the valence band (or conduction band) of the single non-single-crystal semiconductor layer forming the i-type non-single-crystal semiconductor region. The electrons (or holes) thus flowing in the i-type non-single-crystal semiconductor region from the first electrode towards the second one and the holes (or electrons) thus flowing from the second electrode toweards the first one are recombined with each other in the i-type non-single-crystal semiconductor region. As a result of this, light is obtained in the i-type non-single-crystal semiconductor region, and this light is emitted as the output light from the non-single-crystal semiconductor light emitting device.

With the conventional non-single-crystal semiconductor light emitting device described above, light is obtained in the i-type non-single-crystal semiconductor region, as mentioned above. The i-type non-single-crystal semiconductor region is doped with the dangling bond and recombination center neutralizer, as referred to above. In the case where the i-type non-single-crystal semiconductor region is formed of silicon (si) and the dangling bond and recombination center neutralizer is hydrogen (H), the i-type non-single-crystal semiconductor region has such an SiH structure that one hydrogen atom is combined with a bond of one silicon atom. This SiH structure does not act as a luminesence center at room temperature. When the i-type non-single-crystal semiconductor region is not doped with the dangling bond and recombination center neutralizer, no light is produced in the i-type non-single-crystal semiconductor region at room temperature, of course. Accordingly, the above-described non-single-crystal semiconductor light emitting device in which the i-type non-single-crystal semiconductor region is formed of easily available silicon (Si) has not been proposed in practice.

Further, in the conventional non-single-crystal semiconductor light emitting device, those of the electrons (or holes) injected from the first electrode which do not recombine with the holes (or electrons) but reach the second electrode are nonnegligibly large in quantity, and those of the holes (or electrons) injected from the second electrode which do not recombine with the electrons (or holes) but reach the first electrode are also nonnegligibly large in amout. This stems from the construction of the device itself and imposes severe limitations on its light emitting efficiency.

Furthermore, the prior art non-single-crystal semiconductor light emitting device has the defect that the light therefrom cannot be obtained as light close to white light even by a suitable selection of the energy band gap of the i-type non-single-crystal semiconductor layer forming the non-single-crystal semiconductor region.

SUMMARY OF THE INVENTION

It is therefore an object of the present invention to provide a novel non-single-crystal semiconductor light emitting device which is provided with a non-single-crystal semiconductor region formed of silicon.

A non-single-crystal semiconductor light emitting device in accordance with the present invention is comprised of a first electrode, a first non-single-crystal semiconductor layer of a first conductivity type, which is formed on the first electrode and makes ohmic contact therewith, a non-single-crystal semiconductor region formed on the first non-single-crystal semiconductor layer, a second non-single-crystal semiconductor layer which is formed on the non-single-crystal semiconductor region and has a second conductivity type reverse from the first conductivity type, and a second electrode which is formed on the second non-single-crystal semiconductor layer and makes ohmic contact therewith, as is the case with the conventional non-single-crystal semiconductor light emitting device described above.

In a first non-single-crystal semiconductor light emitting device of the present invention which has the abovementioned structure, however, the non-single-crystal semiconductor region has a third non-single-crystal semiconductor layer which is formed of silicon and doped with hydrogen or fluorine in an amount of more than 30 atom %. In this case, a part of the hydrogen or fluorine is doped as a dangling bond and recombination center neutralizer in the third non-single-crystal semiconductor layer. Accordingly, the third non-single-crystal semiconductor layer has the aforementioned SiH structure of similar SiF structure in which one hydrogen or fluorine atom is combined with a bond of one silicon atom. In the third non-single-crystal semiconductor layer, however, the hydrogen or fluorine mostly is so doped as to provide in the third non-single-crystal semiconductor layer a $(SiH_2)_n$ or $(SiF_2)_n$ (where $n > 1$) structure in which $SiH_2$ or $SiF_2$ sturctures, each having two hydrogen or fluorine atoms combined with two bonds of one silicon atom, are linked as a chain. This $SiH_2$ or $(SiH_2)_n$, or $SiF_2$ or $(SiF_2)_n$ structure serves as a luminescence center at room temperature.

In the first non-single-crystal semiconductor light emitting devices according to the present invention, when connecting a bias source across the first and second electrodes in a predetermined polarity, electrons (or holes) are injected into the non-single-crystal semiconductor region from the first electrode towards the second electrode layer, and holes (or electrons) are injected into the non-single-crystal semiconductor region from the second electrode towards the first electrode, as in the case of the aforesaid conventional non-single-crystal semiconductor light emitting device.

In the first non-single-crystal semiconductor light emitting device of the present invention, however the electrons (or holes) injected into the non-single-crystal semiconductor region flow towards the second electrode, and the holes (or electrons) injected into the non-single-crystal semiconductor region flow towards the first electrode, as in the case of the aforesaid conventional non-single-crystal semiconductor light emitting device. The electrons and holes thus flowing in the non-single-crystal semiconductor region recombine with each other in the third non-single-crystal semiconductor layer, since the third non-single-crystal semiconductor layer has the $(SiH_2)_n$ or $(SiF_2)_n$ structure which acts as a luminescence center, even if the third non-single-crystal semiconductor layer is formed of silicon. As a result of this, even if the third non-single-crystal semiconductor layer is formed of silicon, light is produced therein and emitted as the output light of the non-single-crystal semiconductor light emitting device.

In this case, light has spectrums distributed over a wide range of wavelength, even if the third non-single-crystal semiconductor layer is formed of silicon.

A second non-single-crystal semiconductor light emitting device of the present invention is identical in construction with the first non-single-crystal semiconductor light emitting device described above, except in the following points.

The non-single-crystal semiconductor region is formed by a non-single-crystal semiconductor laminate member which is made up of a plurality m (where $m \geq 3$) of third non-single-crystal semiconductor layers $M_1, M_2, \ldots$ and $M_m$ laminated in this order. In this case, of the third non-single-crystal semiconductor $M_1$ to $M_m$, the even-numbered non-single-crystal semiconductor layer $M_i$ (where $i = 2, 4, \ldots (m-1)$) is formed of silicon and doped with hydrogen or fluorine and has the $(SiH_2)_n$ or $(SiF_2)_n$ structure, as in the case of the third non-single-crystal semiconductor layer of the first non-single-crystal semiconductor light emitting device described above. Further, the odd-numbered non-single-crystal semiconductor layer $M_j$ (where $j = 1, 3, \ldots m$) may be formed of silicon carbide expressed by $Si_x C_{1-x}$ (where $0 < x < 1$), silicon nitride expressed by $Si_x N_{4-x}$ (where $0 < x < 4$), or silicon oxide expressed by $SiO_{2-x}$ (where $0 < x < 2$). The energy gaps $Eg_1, Eg_2, \ldots$ and $Eg_m$ of the third non-single-crystal semiconductor layers $M_1, M_2,$ and $M_m$ bear such relationships as $Eg_1 > Eg_2 < Eg_3, Eg_3 > Eg_4 < Eg_5, \ldots$ and $Eg_{(m-2)} > Eg_{(m-1)} < Eg_m$.

In the second non-single-crystal semiconductor light emitting devices according to the present invention, when connecting a bias source across the first and second electrodes in a predetermined polarity, electrons (or holes) are injected into the non-single-crystal semiconductor region from the first electrode towards the second electrode layer, and holes (or electrons) are injected into the non-single-crystal semiconductor region from the second electrode towards the first electrode, as in the case of the first non-single-crystal semiconductor light emitting device.

In the second non-single-crystal semiconductor light emitting devices of the present invention, however, the electrons (or holes) injected into the non-single-crystal semiconductor region are sequentially accumulated at the bottoms of conduction bands (or valence bands) of the third non-single-crystal semiconductor layers $M_2, M_4, \ldots$ and $M_{(m-1)}$ of the non-single-crystal semiconductor region, and the holes (or electrons) injected into the non-single-crystal semiconductor region are also sequentially accumulated at the bottoms of valence bands (or conduction bands) of the third non-single-crystal semiconductor layers $M_2, M_4, \ldots$ and $M_{(m-1)}$. Since the non-single-crystal semiconductor layer $M_i$ (where $i = 2, 4, \ldots (m-1)$), even if formed of silicon, has the $(SiH_2)_n$ or $(SiF_2)_n$ structure which serves as a luminescence center, the electrons and holes accumulated at the bottoms of the conduction band and the valence band of the third non-single-crystal semiconductor layer $M_i$ recombine with each other in the third non-single-crystal semiconductor layer $M_i$, and hence emitting light. Accordingly, in the second non-single-crystal semiconductor light emitting devices of the present invention, the electrons and holes injected into the non-single-crystal semiconductor layers $M_2, M_4, \ldots$ and $M_{(m-1)}$ of the non-single-crystal semiconductor region, and on the basis of the thus accumulated electrons and holes, light $L_2, L_4, \ldots$ and $L_{(m-1)}$ are obtained therefrom, and their composite light L is emitted as the output light from the non-single-crystal semiconductor light emitting device.

According to the second non-single-crystal semiconductor light emitting devices of the present invention, since they have such constructions as referred to above, the amount of electrons (or holes) which are injected from the first electrode into the non-single-crystal semiconductor region but do not recombine with the holes (or electrons) therein and reach the second electrode and the amount of holes (or electrons) injected from the second electrode into the non-single-crystal semiconductor region but do not recombine with the electrons (or holes) therein and reach the first electrode are far smaller than in the case of the aforementioned conventional non-single-crystal semiconductor light emitting device. Therefore, the devices of the present invention are higher in light emitting efficiency than the prior art device.

Moreover, it is possible to obtain light having spectrums distributed over a wide range of wavelength by making all or some of the thickness and the energy gaps $Eg_2, Eg_4, \ldots$ and $Eg_{(m-1)}$ different from one another. Accordingly, for example, near white light can be produced.

Other object, features and advantages of the present invention will become more fully apparent from the following detailed description taken in conjunction with the accompanying drawings.

DESCRIPTION OF THE PREFERRED EMBODIMENTS

Figure 1:
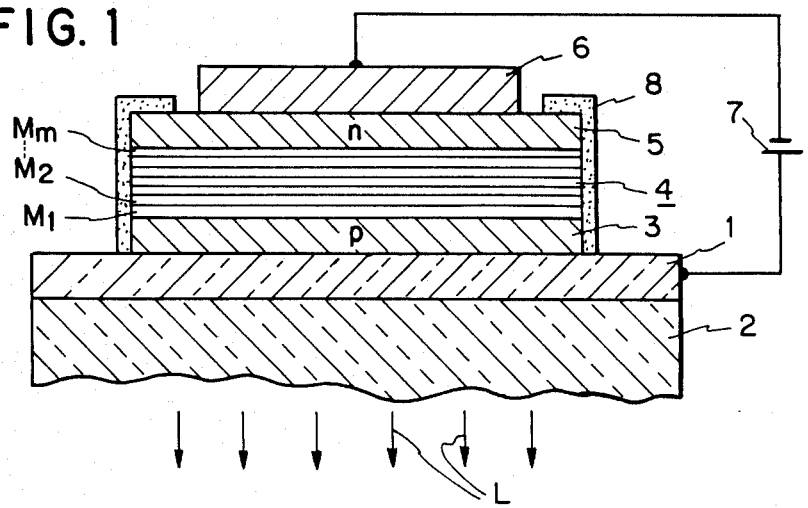
FIG. 1 is a sectional view schematically illustrating a first embodiment of the non-single-crystal semiconductor light emitting device of the present invention.

FIG. 1 illustrates a first embodiment of the non-single-crystal semiconductor light emitting device of the present invention, which has such a construction as follows:

That is, the non-single-crystal semiconductor light emitting device is provided with a first electrode 1.

The electrode 1 is formed in layer on a light-transparent insulating substrate 2 made of glass, ceramics, synthetic resin or the like.

The electrode 1 is light transparent and may be as of tin oxids, indium oxide, antimony oxide, indium-titanium oxide, a mixture of antimony oxide and titanium oxide or the like.

The electrode 1 is covered with a non-single-crystal semiconductor layer 3 which makes ohmic contact therewith.

The non-single-crystal semiconductor layer 3 is made of an amorphous, semi-amorphous or polycrystalline semiconductor. The semi-amorphous semiconductor has such a structure that its degree of crystallization varies spatially, and it is typically a semiconductor which is composed of a mixture of a micro-crystalline semiconductor having a lattice strain and a particle size of 5 to 200 Å and a non-single-crystal semiconductor such as an amorphous semiconductor.

The semiconductor, which forms the non-single-crystal semiconductor layer 3 may be the Group IV element such as silicon Si or germanium Ge, a carbide of the Group IV element such as silicon carbide $Si_xC_{1-x}$ ($0<x<1$) or germanium carbide $Ge_xC_{1-x}$ ($0<x<1$), a nitride of the Group IV element such as silicon nitride $Si_3N_{4-x}$ ($0<x<4$) or germanium nitride $Ge_3N_{4-x}$ ($0<x<4$), an oxide of the Group IV element such as silicon oxide $SiO_{2-x}$ ($0<x<2$), or a Group IV elements compound such as $Ge_xSi_{1-x}$ ($0<x<1$).

The non-single-crystal semiconductor layer 3 is doped with the Group III element which is a p type impurity, such as boron B, aluminum Al, or indium In, to make the layer 3 p-type.

The non-single-crystal semiconductor layers 3 is doped with a dangling bond and recombination center neutralizer such as hydrogen, or halogen such as fluorine.

The non-single-crystal semiconductor layer 3 is formed by a known CVD, plasma CVD, photo plasma CVD or photo CVD method, using the known material gas of the abovesaid semiconductor and the known material gas of the abovesaid P-type impurity. In this case, when the non-single-crystal semiconductor layer 3 is formed of, for example, silicon, silane ($Si_pH_{(2p+2)}$, where $p \geq 1$) or silicon difluoride ($SiF_2$) can be used as the semiconductor material gas. Further, diborane ($B_2H_6$) can be used as the P-type impurity. When the semiconductor material gas or the impurity material gas is not included with the aforesaid dangling bond and the recombination center neutralizer, they are used together with the semiconductor material gas and the impurity material gas.

The non-single-crystal semiconductor layer 3 is covered with a non-single-crystal semiconductor region 4 which is formed thereon in layers.

The non-single-crystal semiconductor layer 4 is formed by a non-single-crystal semiconductor laminate member which is made up of a plurality m (where $m \geq 3$) of non-single-crystal semiconductor layers $M_1$, $M_2$, ... and $M_m$ sequentially laminated in this order.

Figure 2:
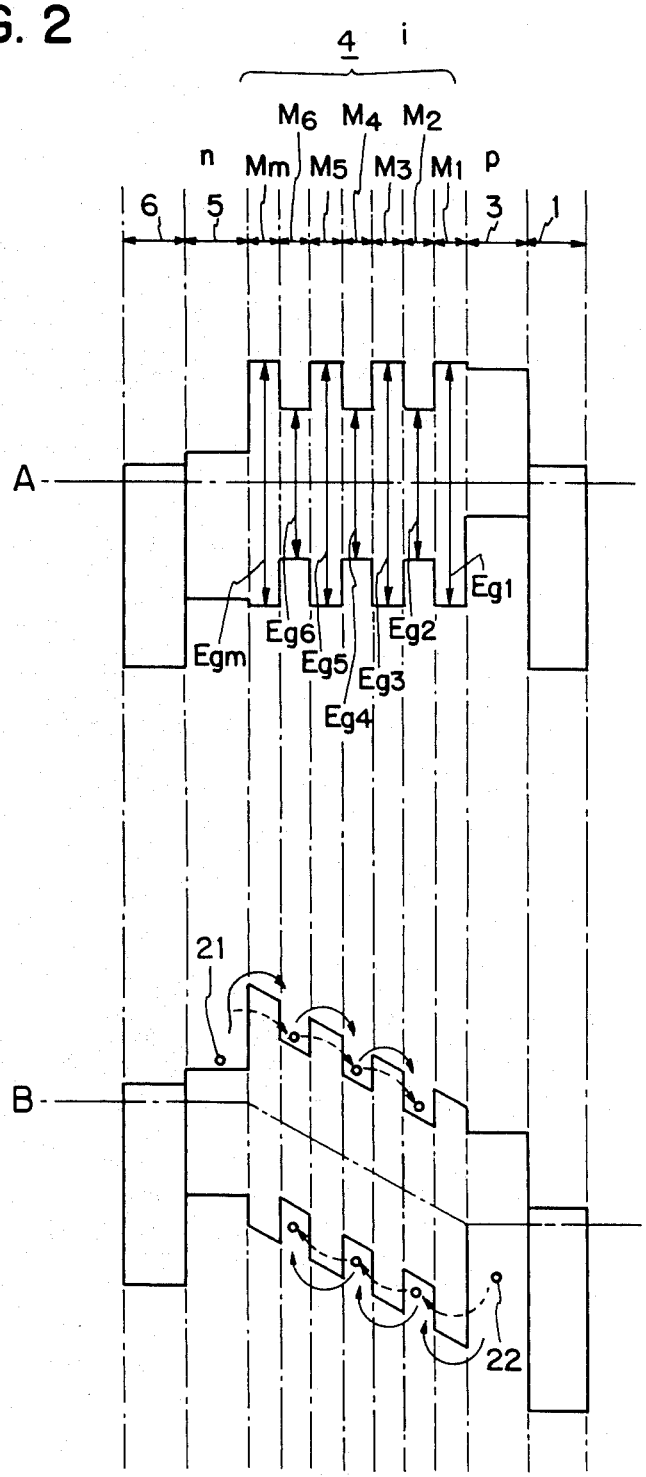
FIG. 2A is a diagram showing its energy band, explanatory of the device.
FIG. 2B is a diagram its energy band during operation, explanatory of the device.

Now, letting the energy gaps of the non-single-crystal semiconductor layers $M_1$, $M_2$, ... and $M_m$ be represented by $Eg_1$, $Eg_2$, ... and $Eg_m$, respectively, they bear such relationships as $Eg_1 > Eg_2 < Eg_3$, $Eg_3 > Eg_4 < Eg_5$, ... and $Eg_{(m-2)} > Eg_{(m-1)} > Eg_m$, shown in FIG. 2. Accordingly, the energy gap of an even-numbered non-single-crystal semiconductor layer $M_i$ ($i=2, 4 ... (m-1)$) is smaller than those of two odd-numbered non-single-crystal semiconductor layers $M_{(i-1)}$ and $M_{(i+1)}$ adjoining thereto; namely, they bear such a relationship as $Eg_{(i-1)} > Eg_i < Eg_{(i+1)}$.

The even numbered one $M_i$ of the non-single-crystal semiconductor layers $M_1$ to $M_m$ is formed of silicon and doped with hydrogen or fluorine in an amount of more than 30 atom %. A part of the hydrogen or fluorine is doped as the dangling bond and recombination center neutralizer. Accordingly, the non-single-crystal semiconductor layer $M_1$ has the SiH or SiF structure in which one hydrogen or fluorine atom is combined with a bond of silicon atom. In the non-single-crystal semiconductor layer $M_i$, however, the hydrogen or fluorine mostly is so doped as to provide in the layer $M_i$ the $(SiH_2)_n$ or $(SiF_2)_n$ (where $n>1$) structure in which the $SiH_2$ or $SiF_2$ sturctures, each having two hydrogen or fluorine atoms combined with two bonds of one silicon atom, are linked as a chain. The $(SiH_2)_n$ or $(SiF_2)_n$ structure functions as a luminescence center at room temperature.

The odd-numbered non-single-crystal semiconductor layers $M_{(i-1)}$ and $M_{(i+1)}$ can be made of silicon carbide, silicon nitride, or silicon oxide. In this case, however, the semiconductor of the non-single-crystal semiconductor layers $M_{(i-1)}$ and $M_{(i+1)}$ must be selected from the aforesaid semiconductors so that the abovementioned relationships $Eg_{(i-1)} > Eg_i < Eg_{(i+1)}$ is obtained.

The non-single-crystal semiconductor layers $M_1$ to $M_m$ are not doped with any of the Group III and V elements or they are doped with them so that the conductivity type of the layers $M_1$ to $M_m$ may be compensated for, making the layers $M_1$ to $M_m$ exhibit the i conductivity type.

The odd-numbered non-single-crystal semiconductor layer $M_j$ (where $j=1, 3 ... m$) is doped with the aforementioned dangling bonds and the recombination center neutralizer, as is the case with the non-single-crystal semiconductor layer 3.

It is preferable that the non-single-crystal semiconductor layers $M_1$ to $M_m$ be smaller in thickness than the non-single-crystal semiconductor layer 3, for example, 100 Å or less in thickness.

The even-numbered non-single-crystal semiconductor layer $M_i$ can be formed by, for instance, a plasma CVD method using silane ($Si_pH_{(2p+2)}$) or silicon difluoride ($SiF_2$), as in the case where the abovesaid non-single-crystal semiconductor layer 3 is formed of silicon (Si). In this case, however, in order that the non-single-crystal semiconductor layer $M_i$ is doped with a large quantity of hydrogen or fluorine to provide therein the $(SiH_2)_n$ or $(SiH_2)_n$ structure, the substrate 2 is held at a lower temperature than in the case of forming the layer 3, for example, $-70°$ to $100°$ C., for instance, at room temperature. The layer $M_i$ thus obtained contains hydrogen or fluorine in an amount of more than 30 atom %, especially, as much as 30 to 50 atom % as a whole. The layer $M_i$ has a larger energy gap (for example, 2.2 to 2.7 eV) than does silicon itself.

The odd-numbered non-single-crystal semiconductor layer $M_j$ (where $j = 1, 3, \ldots m$) can be formed by known various CVD methods using the known semiconductor material gas, if necessary, together with the dangling bond and the recombination center neutralizer, as in the case of the non-single-crystal semiconductor layer 3.

when the odd-numbered non-single-crystal semiconductor layer $M_j$ (where $j = 1, 3, \ldots m$) is formed of, for instance, $Si_xN_{4-x}$ (where $0 < x < 4$), a gas mixture of the aforesaid silane gas and ammonia gas can be used as the semiconductor material gas. When the non-single-crystal semiconductor layer $M_j$ is formed of, for example, $SiO_{2-x}$ (where $0 < x < 2$), a gas mixture of the aforesaid silane gas and oxygen gas can be used as the semiconductor material gas. Further, when the non-single-crystal semiconductor layer is formed of, for example, $Si_xC_{1-x}$ (where $0 < x < 1$), a gas mixture of methane gas and the aforesaid silane gas, silicon carbide gas or methyl silane ($Si(CH_3)_nH_{4-n}$ (where $1 \leq n \leq 4$) can be employed. The layer $M_j$ thus obtained has a larger energy gap (for example, 2.3 to 3.5 eV) than does the layer $M_i$.

The layered non-single-crystal semiconductor region 4 formed by the laminate member composed of the non-single-crystal semiconductor layers $M_1$ to $M_m$ is covered with a non-single-crystal semiconductor layer 5.

The non-single-crystal semiconductor layer 5 is formed of the amorphous, semi-amorphous or polycrystalline semiconductor, as in the cases of the non-single-crystal layer 3 and the non-single-crystal semiconductor region 4.

The non-single-crystal semiconductor layer 5 can be made of the aforementioned Group IV element, its carbide, nitride or oxide, or its compound semiconductor, as in the case of the non-single crystal semiconductor layer 3.

The non-single-crystal semiconductor layer 5 is doped with the Group V element which is an n type impurity, such as phosphorus P, arsenic As, or antimony Sb, rendering the layer 5 n-type.

The non-single-crystal semiconductor layer 5 is doped with the aforesaid dangling bond and recombination center neutralizer, as is the case with the non-single-crystal semiconductor layer 3.

The non-single-crystal semiconductor layer 5 can be formed by the known various CVD methods, using the aforementioned known semiconductor material gas and the aforesaid known n-type impurity material gas, together with the dangling bond and the recombination center neutralizer, as required, as in the case of the non-single-crystal semiconductor layer 3. In this case, phosphin ($PH_3$) gas can be used as the n-type impurity material gas.

The non-single-crystal semiconductor layer 5 is covered with an electrode 6 which is formed in layers on the non-single-crystal semiconductor layer 5 to make ohmic contact therewith.

The electrode 6 is non-light transparent and may be formed of, for instance, aluminum (Al), nickel (Ni), cobalt (Co) or molybdenum (Mo). Alternatively, the electrode 6 may also be formed to have such a structure that a reflecting layer made of aluminum, cobalt or molybdenum is laminated on a light-transparent electrode layer made of the material usable for the electrode 1, though not shown.

The side surface of the non-single-crystal semiconductor region 4 is covered with a protective insulating layer 8 which extends on the side surfaces of the non-single-crystal semiconductor layers 3 and 5 to cover the electrode 1 and the layer 5, thus protecting the region 4 and preventing the diffusion of the hydrogen or fluorine from the layer $M_i$ of the region 4 to the outside thereof.

With the non-single-crystal semiconductor light emitting device of such a construction according to the present invention, it is possible to obtain such an operation as follows:

By connecting a DC bias source 7 across the electrodes 1 and 6 with the side of the electrode 2 made positive, the pin structure constituted by the non-single-crystal semiconductor layer 3, the non-single-crystal semiconductor region 4 and the non-single-crystal semiconductor layer 5 is biased in the forward direction.

In consequence, electrons 21 are injected from the electrode 6 into the non-single-crystal semiconductor region 4 towards the electrode 1 across the ni junction defined between the non-single-crystal semiconductor layer 5 and the non-single-crystal semiconductor region 4. Further, holes 22 are injected from the electrode 1 into the non-single-crystal semiconductor region 4 towards the electrode 6 across the pi junction defined between the non-single-crystal semiconductor layer 3 and the non-single-crystal semiconductor region 4.

The electrons 21 thus injected into the non-single-crystal semiconductor region 4 are sequentially accumulated at the bottoms of conduction bands of its even-numbered non-single-crystal semiconductor layers $M_{(m-1)}, M_{(m-3)}, \ldots$ and $M_2$, since their energy gaps $Eg_{(m-1)}, Eg_{(m-3)}, \ldots$ and $Eg_2$ are narrower than those of the non-single-crystal semiconductor layers $M_m$, $M_{m-2}, \ldots$ and $M_1$. In this case, the electrons 21 flow though the non-single-crystal semiconductor layers $M_m, M_{m-2} \ldots$ and $M_3$ one after another along their conduction bands or in the case where these layers are sufficiently thin, the electrons 21 tunnel therethrough one after another.

On the other hand, the holes 22 injected into the non-single-crystal semiconductor region 4 are sequentially accumulated at the bottoms of the valence bands of the non-single-crystal semiconductor layers $M_2, M_4, \ldots$ and $M_{(m-1)}$, as is the case with electrons.

The electrons 21 and the holes 22 thus accumulated at the bottoms of the conduction band and the valence band of the non-single-crystal semiconductor layer $M_i$ undergo a compound radiative recombination as by band-to-band recombination, band-to-recombination center recombination and recombination between recombination centers in the non-single-crystal semiconductor layer $M_i$. As a result of this, light $L_i$ is produced in the non-single-crystal semiconductor layer $M_i$, and composite light L of light $L_2, L_4, \ldots$ and $L_{(m-1)}$ is emitted to the outside.

Since the light $L_i$ from the non-single-crystal semiconductor layer $M_i$ is obtained by the abovesaid compound radiative recombination, it has spectrums distributed over a wide range of wavelength. Accordingly, the light $L_i$ can be obtained as light close to white light.

By making all or some of the thickness and the energy band gaps $Eg_2, Eg_4, \ldots$ and $Eg_{(m-1)}$ of the non-single-crystal semiconductor layers $M_2, M_4, \ldots$ and $M_{(m-1)}$ different, the light $L_2, L_4, \ldots$ and $L_{(m-1)}$ can be made entirely or partly different. Therefore, the composite light L can be obtained as light close to white light.

Since the electrons 21 which are injected from the electrode 6 into the non-single-crystal semiconductor region 4 towards the electrode 1 are sequentially accumulated in the non-single-crystal semiconductor layers $M_{(m-1)}, M_{(m-3)}, \ldots$ and $M_2$, the amount of electrons 21 which do not recombine with the holes 22 but reach the electrode 1 can be reduced far smaller than in the case of the conventional non-single-crystal semiconductor light emitting device described previously. Moreover, since the holes 22 which are injected from the electrode 1 into the non-single-crystal semiconductor region 4 towards the electrode 6 are also sequentially accumulated in the non-single-crystal semiconductor layers $M_2, M_4, \ldots$ and $M_{(m-1)}$, the amount of holes 22 which do not recombine with the electrons 21 but reach the electrode 6 can be decreased far smaller than in the case of the aforementioned prior art device.

Thus, the non-single-crystal semiconductor light emitting device of the present invention shown in FIG. 1 achieves a light emitting efficiency far higher than does the aforementioned conventional non-single-crystal semiconductor light emitting device.

Further, the odd-numbered non-single-crystal semiconductor layers $M_{(i-1)}$ and $M_{(i+1)}$ prevents the diffusion of hydrogen or fluorine from the even-numbered non-single-crystal semiconductor region $M_i$ towards the non-single-crystal semiconductor layers 3 and 5. Therefore, the non-single-crystal semiconductor light emitting device serves with high efficiency for a long time.

The foregoing description should be construed as merely illustrative of the present invention and should not be construed as limiting the invention specifically thereto.

Figure 3:
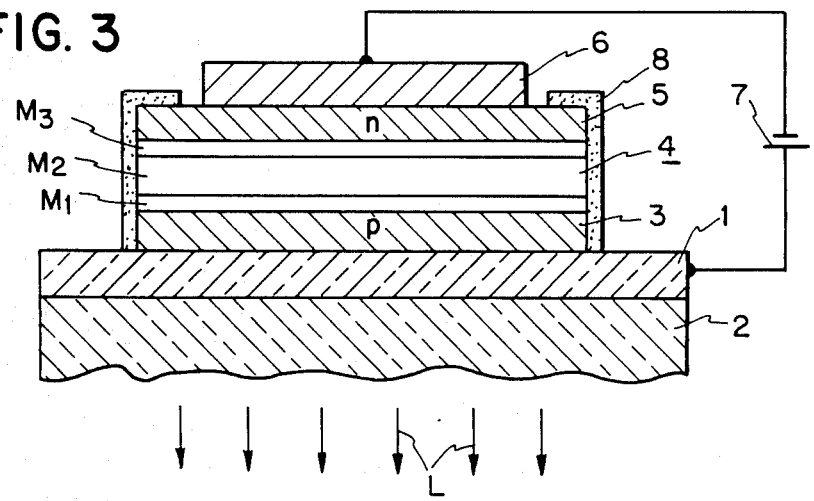
FIGS. 3 and 4 are sectional views schematically illustrating second and third embodiments of the non-single-crystal semiconductor light emitting device of the present invention, respectively.

Also it is possible to employ, for example, such a structure as shown in FIG. 3 corresponding to FIG. 1. The structure shown in FIG. 3 is identical in construction with the structure of FIGS. 1 and 2 except that the number m of the non-single-crystal semiconductor layers $M_1$ to $M_m$ forming the non-single-crystal semiconductor region 4 is three, and the even-numbered layer $M_2$ is sufficiently thicker than the odd-numbered layers $M_1$ and $M_3$.

Figure 4:
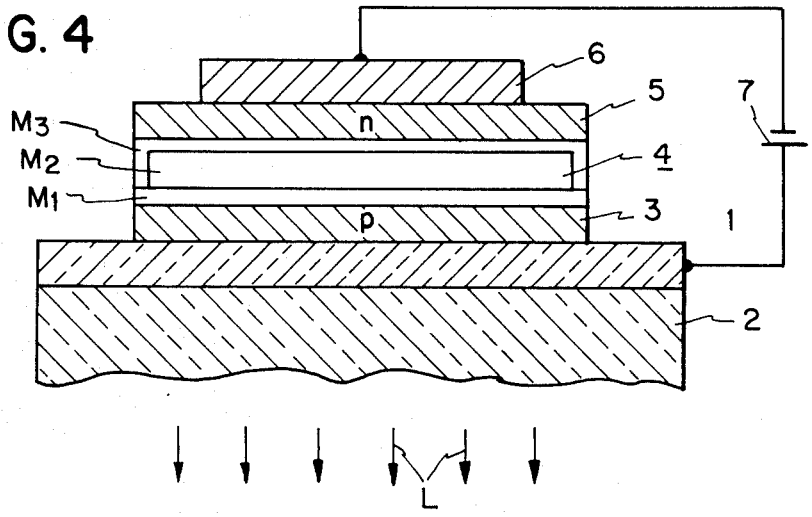

Furthermore, it is possible to employ such a structure as shown in FIG. 4. The structure shown in FIG. 4 is identical in construction with the structure of FIG. 3 except that the protective insulating layer 8 is omitted, but the even-numbered layer $M_2$ constituting the non-single-crystal semiconductor region 4 is formed a size smaller than the layer $M_1$, and the layer $M_3$ is formed to extend over the entire side surface of the layer $M_2$ to reach the layer $M_1$, protecting the layer $M_2$ which produces light.

It is evident that the structure of FIGS. 3 and 4 also produce light by the same operation as described previously in connection with FIGS. 1 and 2.

Moreover, it is also possible to employ such a structure that the layers $M_1$ and $M_3$ in FIG. 3 are omitted and the non-single-crystal semiconductor region 4 is formed by the layer $M_2$ alone, though not shown. It is seen that light can also be emitted from such a structure.

Further, while the foregoing description has been given of the case where the first electrode is light transparent and the second electrode is reflective, they may also be reflective and transparent, respectively.

Moreover, while the foregoing description has been given of the case where the non-single-crystal semiconductor region 4 is i-type, it may also be a p-type region sufficiently lower in impurity concentration than the p-type non-single-crystal semiconductor layer 3, or an n-type region sufficiently lower in impurity concentration than the n-type non-single-crystal semiconductor layer 5.

It will be apparent that many modifications and variations may be effected without departing from the scope of the novel concepts of the present invention.

What is claimed is:

1. A non-single-crystal semiconductor light emitting device comprising:
    a first electrode;
    a first conductivity type non-single-crystal semiconductor layer formed on the first electrode and making ohmic contact therewith;
    an intrinsic non-single-crystal semiconductor region formed on the first conductivity type non-single-crystal semiconductor layer;
    a second conductivity type non-single-crystal semiconductor layer formed on the intrinsic non-single-crystal semiconductor region; and
    a second electrode formed on the second conductivity type non-single-crystal semiconductor layer and making ohmic contact therewith;
    wherein the intrinsic non-single-crystal semiconductor region is formed by at least one intrinsic non-single-crystal semiconductor layer, the intrinsic non-single crystal layer being formed of silicon and doped with hydrogen or fluorine to provide therein an $(SiH_2)_n$ or $(SiF_2)_n$ structure in which $SiH_2$ or $SiF_2$ structures, each having two hydrogen or fluorine atoms combined with two bonds of the one silicon atom, are linked as a chain, and to have an energy gap of 2.2 to 2.7 eV; and
    wherein either one of the first and second electrodes is light transparent.

2. A non-single-crystal semiconductor light emitting device according to claim 1, wherein the intrinsic non-single-crystal semiconductor layer of the non-single-crystal semiconductor region is doped with hydrogen or fluorine in an amount of more than 30 atom %.

3. A non-single-crystal semiconductor light emitting device according to claim 1, wherein the side surface of the non-single-crystal semiconductor region is covered with a protective insulating layer.

4. A non-single-crystal semiconductor light emitting device according to claim 1, wherein the intrinsic non-single-crystal semiconductor layer of the non-single-crystal semiconductor region is in contact with the first and second conductivity type non-single-crystal semiconductor layers.

5. A non-single-crystal semiconductor light emitting device according to claim 1, wherein the other one of the first and second electrode is reflective.

6. A non-single-crystal semiconductor light emitting device comprising:

a first electrode;

a first conductivity type non-single-crystal semiconductor layer formed on the first electrode and making ohmic contact therewith;

an intrinsic non-single-crystal semiconductor region formed on the first conductivity type non-single-crystal semiconductor layer;

a second conductivity type non-single-crystal semiconductor layer formed on the intrinsic non-single-crystal semiconductor region; and a second electrode formed on the second conductivity type non-single-crystal semiconductor layer and making ohmic contact therewith;

wherein the intrinsic non-single-crystal semiconductor region is formed by a non-single-crystal semiconductor laminate member made up of a plurality m (where $m \geq 3$) of intrinsic non-single-crystal semiconductor layers $M_1, M_2, \ldots M_m$ sequentially laminate in this order, wherein the even-numbered intrinsic non-single-crystal semiconductor layer $M_i$ (where $i = 2, 4, \ldots (m-1)$) of the non-single-crystal semiconductor region is formed of silicon and doped with hydrogen or fluorine to provide therein an $(SiH_2)_n$ or $(SiF_2)_n$ structure in which $SiH_2$ or $SiF_2$ structures, each having two hydrogen or fluorine atoms combined with two bonds of the one silicon atom, are linked as a chain, and to have an energy gap Egi of 2.2 to 2.7 eV;

wherein the odd-numbered intrinsic non-single-crystal semiconductor layer $M_j$ (where $j = 1, 3 \ldots m$) of the non-single-crystal semiconductor region is formed of silicon carbide, silicon nitride, or silicon oxide and has energy gap Egj of 2.3 to 3.5 eV;

wherein the energy gaps $Eg_1, Eg_2, \ldots$ and $Eg_m$ of the intrinsic non-single-crystal semiconductor layers $M_1, M_2, \ldots$ and $M_m$ bear such relationships as $Eg_1 > Eg_2 < Eg_3$, $Eg_3 > Eg_4 < Eg_5, \ldots Eg_{(m-2)} > Eg_{(m-1)} < Eg_m$; and wherein either one of the first and second electrodes is light transparent.

7. A non-single crystal according to claim 6, wherein the intrinsic non-crystal layer Mi of the non-crystal region is doped with hydrogen or fluorine in an amount of more than 30 atom %.

8. A non-single-crystal semiconductor light emitting device according to claim 6, wherein the side surface of the non-single-crystal semiconductor region is covered with a protective insulating layer.

9. A non-single-crystal semiconductor light emitting device according to claim 6, wherein the number m is three, and the non-single-crystal semiconductor layer $M_3$ is formed to extend over the side surface of the non-single-crystal semiconductor layer $M_2$ to protect it.

10. A non-single-crystal semiconductor light emitting device according to claim 6, wherein the other one of the first and second electrodes is reflective.

* * * * *